(12) United States Patent
Krapf et al.

(10) Patent No.: US 9,103,929 B2
(45) Date of Patent: Aug. 11, 2015

(54) DEVICE FOR DETECTING THE PRESENCE OF AN ITEM IN AN EXAMINATION OBJECT

(75) Inventors: Reiner Krapf, Filderstadt (DE); Bjoern Haase, Stuttgart (DE); Kai Renz, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 901 days.

(21) Appl. No.: 13/133,931

(22) PCT Filed: Dec. 7, 2009

(86) PCT No.: PCT/EP2009/066477
§ 371 (c)(1),
(2), (4) Date: Aug. 29, 2011

(87) PCT Pub. No.: WO2010/066659
PCT Pub. Date: Jun. 17, 2010

(65) Prior Publication Data
US 2011/0304314 A1    Dec. 15, 2011

(30) Foreign Application Priority Data
Dec. 10, 2008    (DE) .................... 10 2008 054 460

(51) Int. Cl.
*G01R 19/00* (2006.01)
*G01R 27/26* (2006.01)
*G01V 3/15* (2006.01)

(52) U.S. Cl.
CPC .............. *G01V 3/15* (2013.01); *G01R 27/2605* (2013.01)

(58) Field of Classification Search
USPC .................................................. 324/67, 658
See application file for complete search history.

(56) References Cited

U.S. PATENT DOCUMENTS

| | | | | |
|---|---|---|---|---|
| 4,853,617 A | * | 8/1989 | Douglas et al. | 324/67 |
| 4,992,741 A | * | 2/1991 | Douglas et al. | 324/671 |
| 5,917,314 A | | 6/1999 | Heger et al. | |
| 6,211,662 B1 | | 4/2001 | Bijawat et al. | |
| 7,504,817 B2 | * | 3/2009 | Sanoner et al. | 324/67 |
| 2003/0218469 A1 | | 11/2003 | Brazell et al. | |
| 2005/0194959 A1 | | 9/2005 | Miller | |
| 2007/0102623 A1 | * | 5/2007 | Fengler et al. | 250/208.1 |
| 2007/0290671 A1 | * | 12/2007 | Skultety-Betz et al. | 324/67 |
| 2013/0193955 A1 | * | 8/2013 | Krapf et al. | 324/207.12 |

FOREIGN PATENT DOCUMENTS

| | | |
|---|---|---|
| CN | 1475813 A | 2/2004 |
| DE | 36 00 446 A1 | 7/1987 |
| WO | 03073130 A1 | 9/2003 |

OTHER PUBLICATIONS

International Search Report corresponding to PCT Application No. PCT/EP2009/066477, mailed Aug. 26, 2010 (German and English language document) (9 pages).

* cited by examiner

*Primary Examiner* — Jay Patidar
(74) *Attorney, Agent, or Firm* — Maginot, Moore & Beck LLP

(57) ABSTRACT

A position-finding apparatus, particularly a handheld position-finding appliance, having a position-finding unit, is provided for the purpose of using a measurement signal to detect the presence of an article arranged in an examination object and which has a sensor unit, a computation unit, and a display unit. The computation unit associates differing sensor elements of the sensor unit with differing display points of the display unit in at least one dimension.

15 Claims, 7 Drawing Sheets

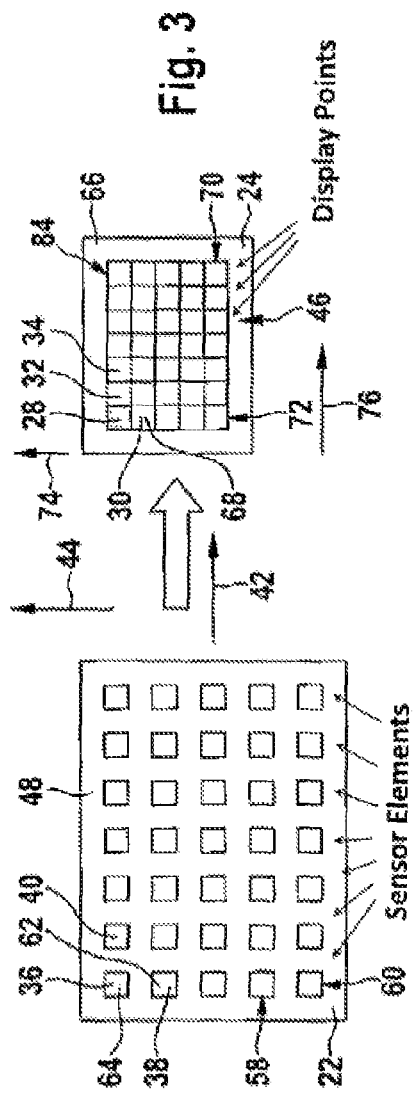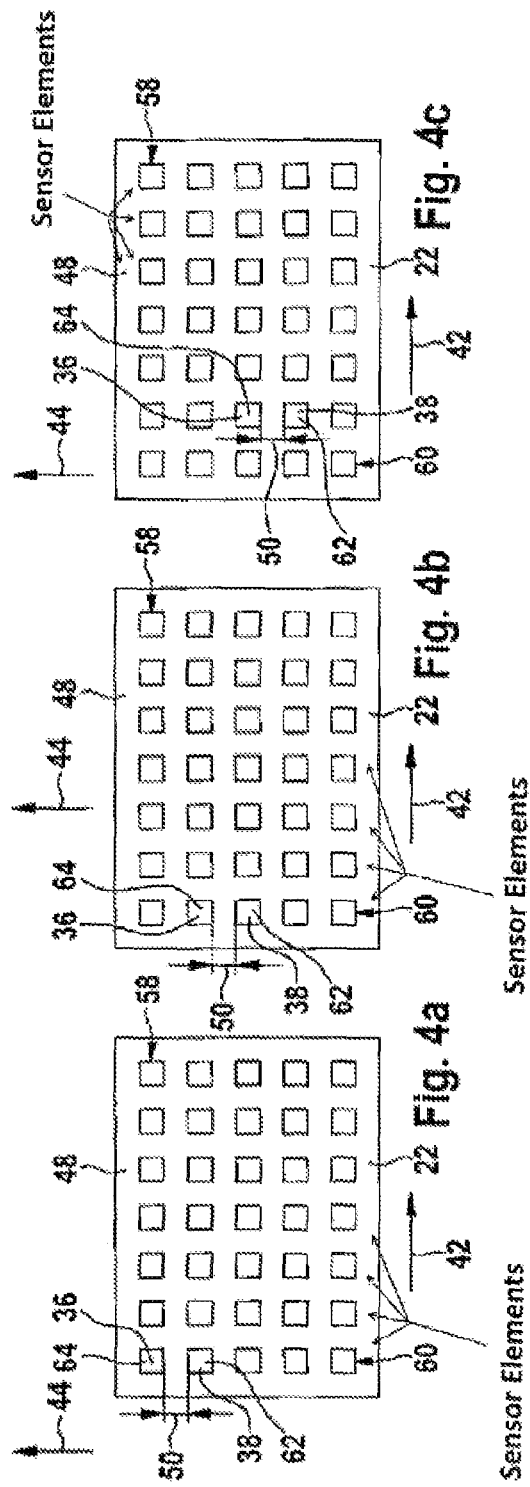

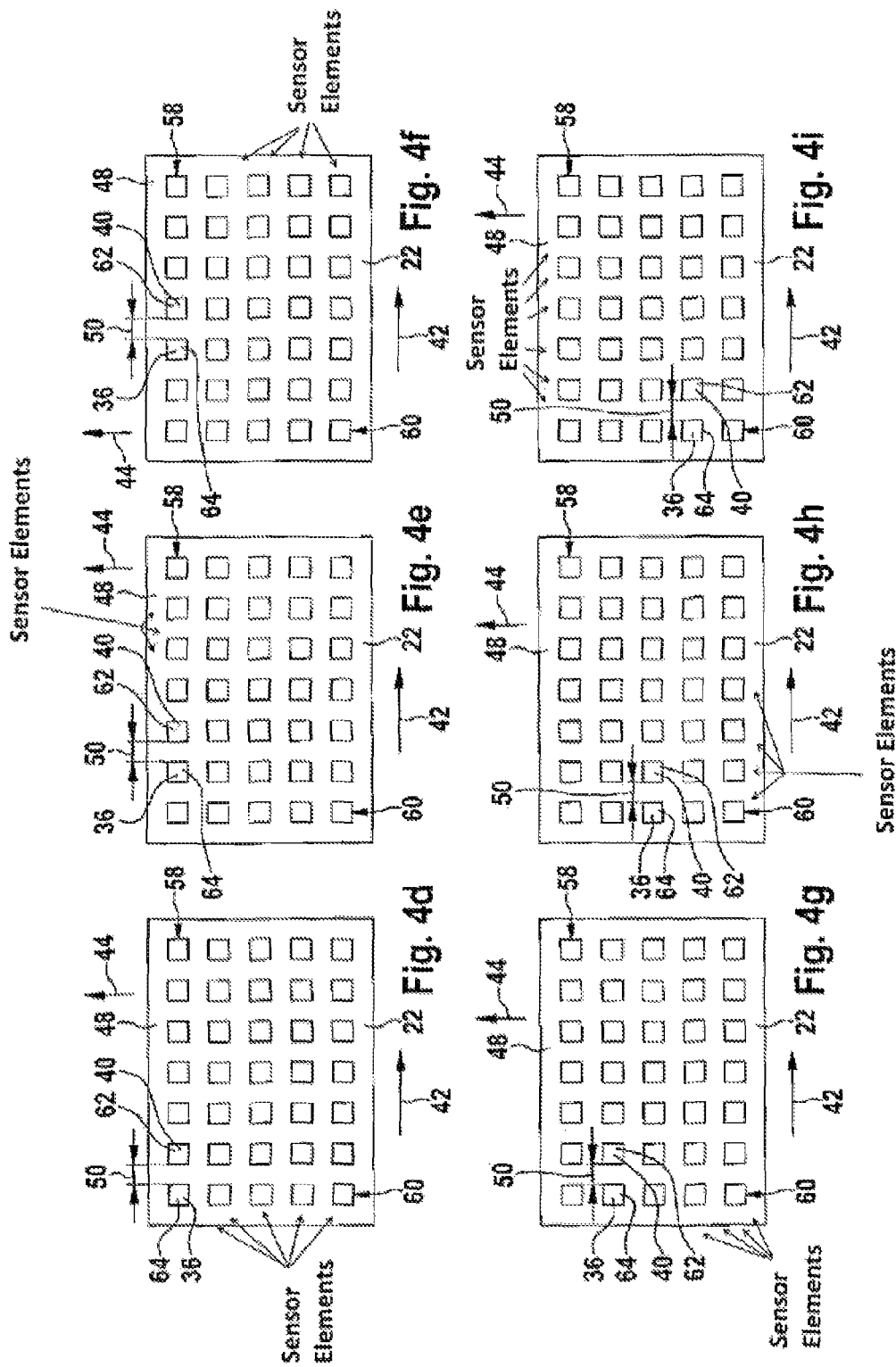

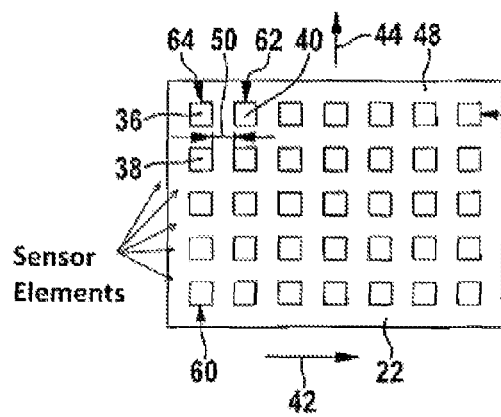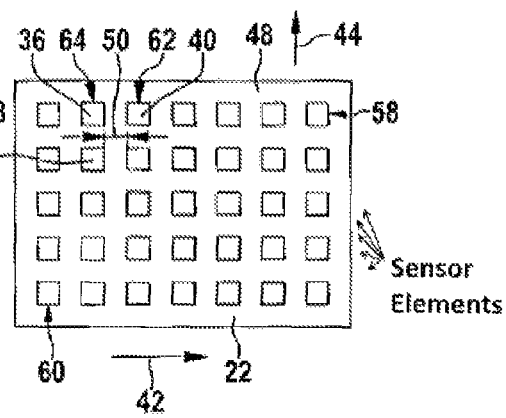
Fig. 5a   Fig. 5b
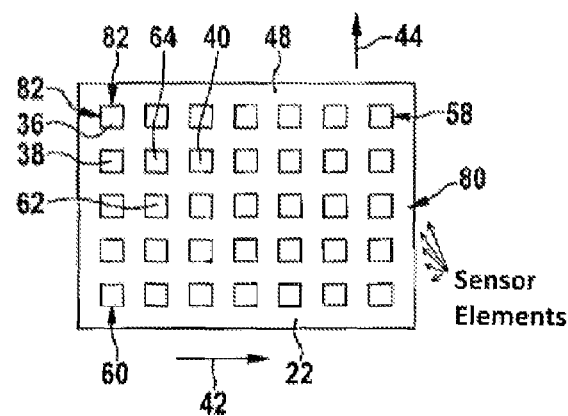
Fig. 6

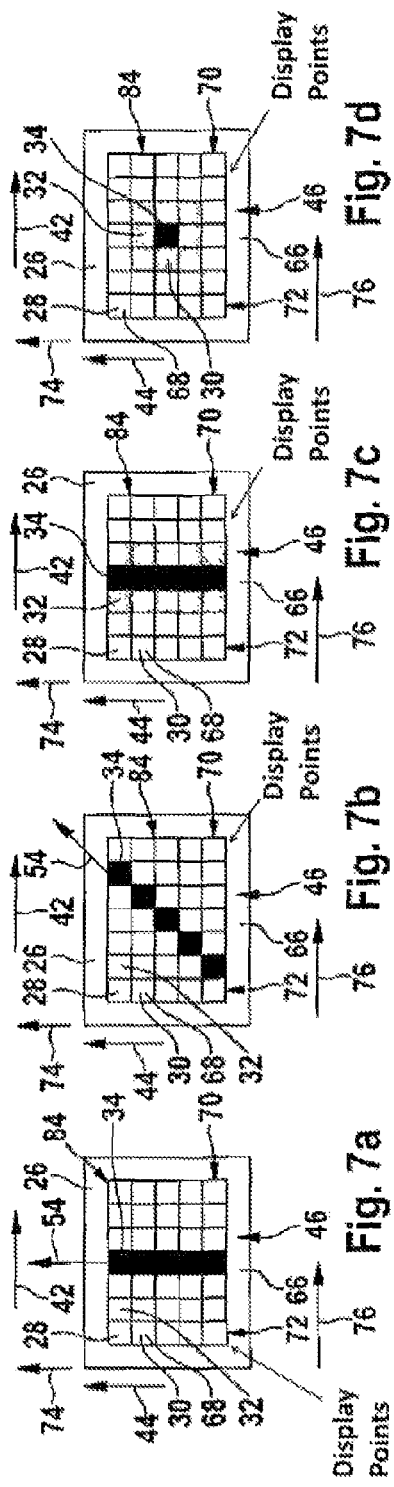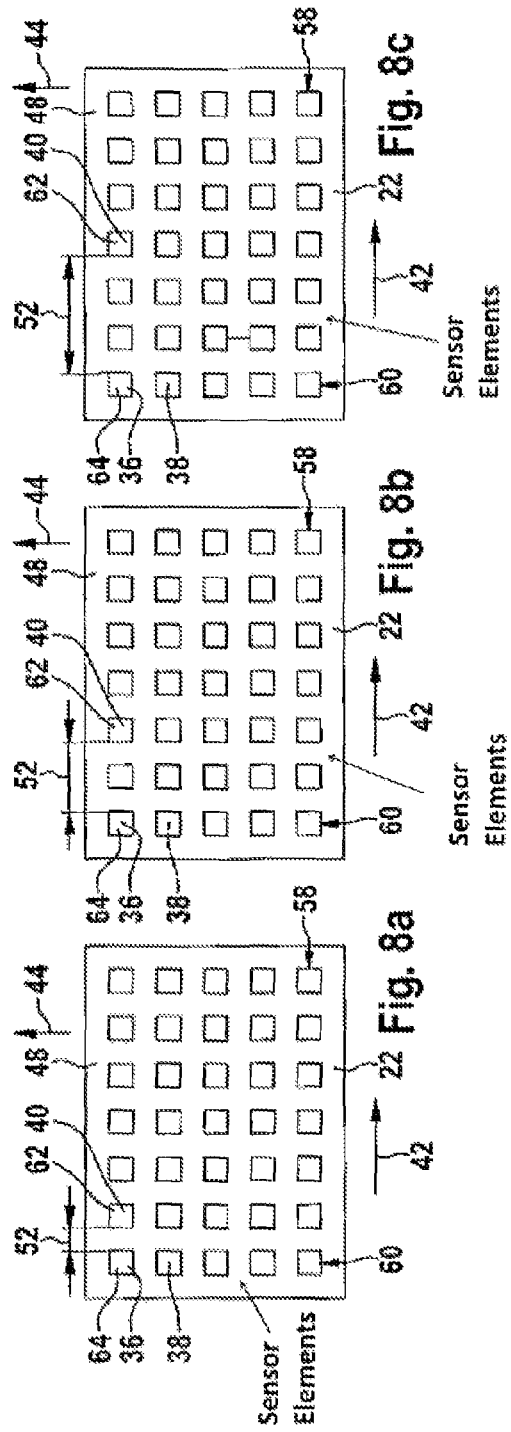

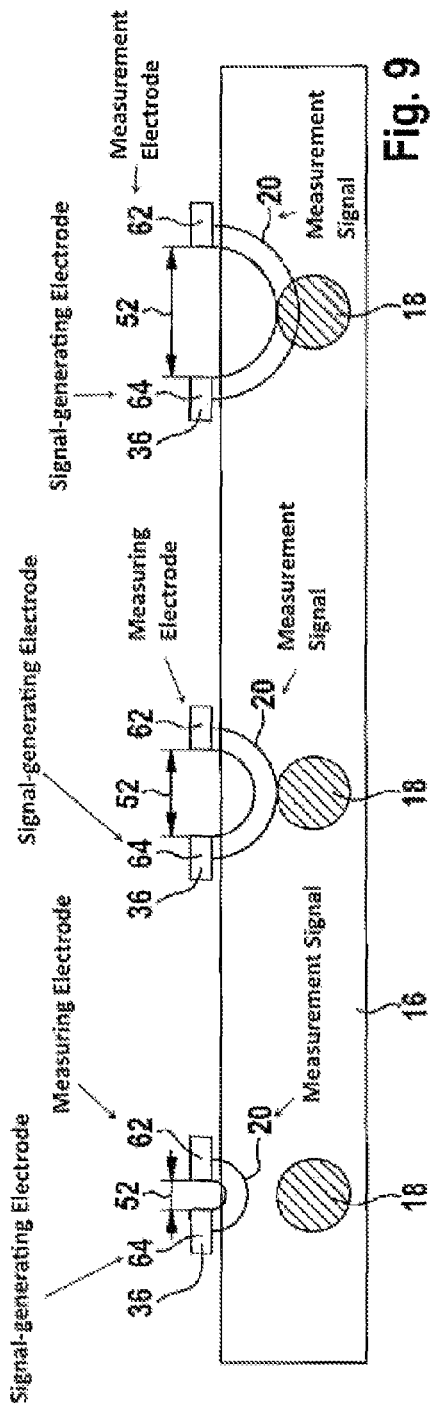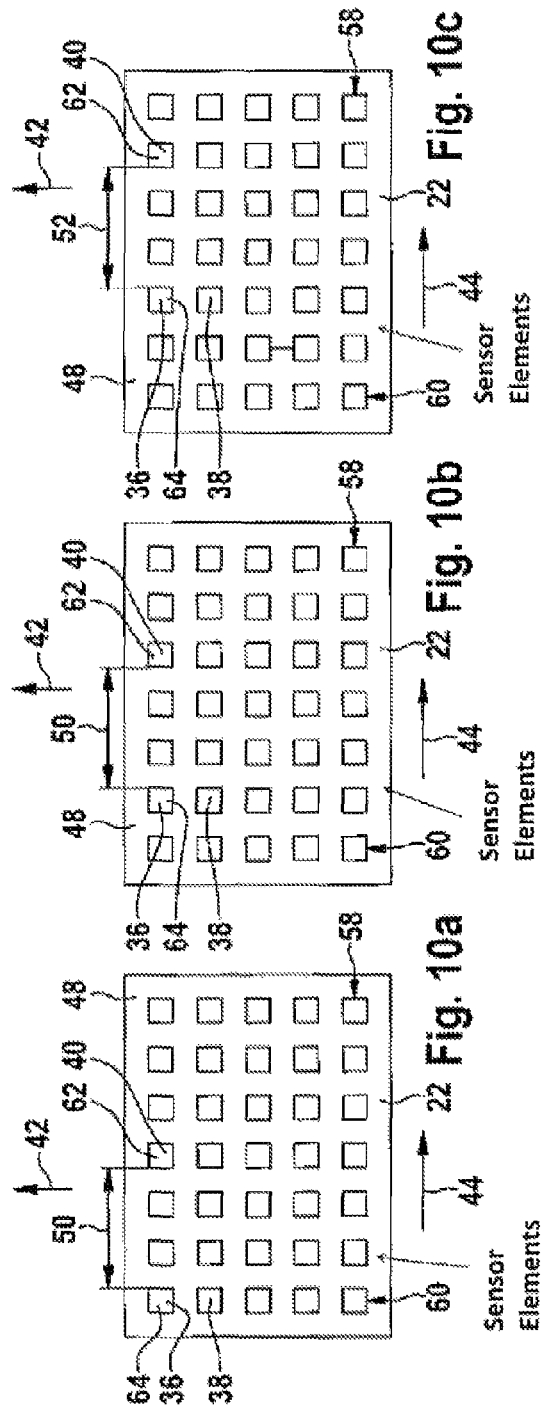

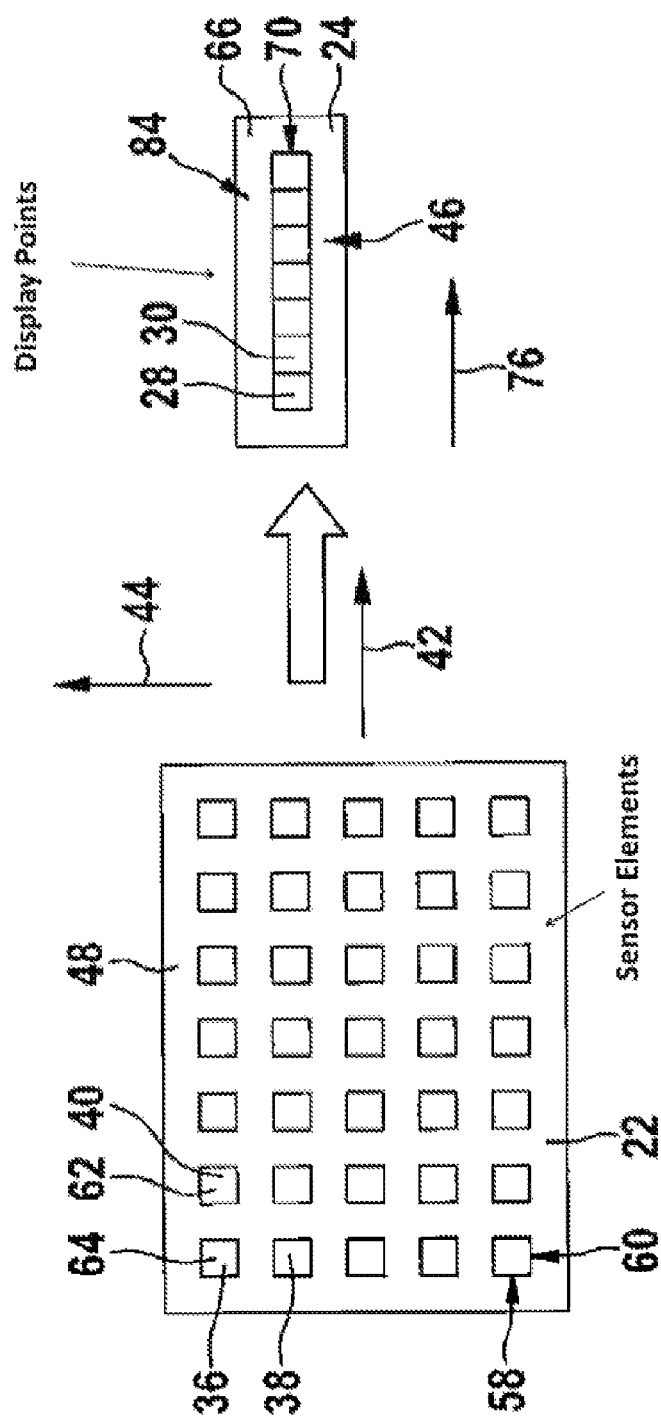

DEVICE FOR DETECTING THE PRESENCE OF AN ITEM IN AN EXAMINATION OBJECT

This application is a 35 U.S.C. §371 National Stage Application of PCT/EP2009/066477, filed Dec. 7, 2009, which claims the benefit of priority to Serial No. 10 2008 054 460.4, filed Dec. 10, 2008 in Germany, the disclosures of which are incorporated herein by reference in their entirety.

BACKGROUND

The disclosure is based on a position-finding apparatus as described herein.

A position-finding apparatus, in particular a handheld position-finding device, is described herein. The position-finding apparatus has a position-finding unit, which is intended to detect the presence of an item arranged in an examination object using a measurement signal and has a sensor unit and a computation unit, and a display unit.

SUMMARY

The disclosure is based on a position-finding apparatus, in particular a handheld position-finding device, having a position-finding unit, which is intended to detect the presence of an item arranged in an examination object using a measurement signal and has a sensor unit and a computation unit, and a display unit.

The disclosure proposes that the computation unit is intended to assign differing sensor elements of the sensor unit to differing display points of the display unit along at least one dimension. In this context, "intended" should be understood as meaning, in particular, specially equipped and/or specially designed and/or specially programmed. Furthermore, a "computation unit" should be understood as meaning, in particular, a unit which may be formed by an evaluation unit and/or a signal processing unit, the computation unit being able to be formed both by a processor alone and, in particular, by a processor and further electronic components, for example a memory means. In a particularly advantageous manner, the computation unit may have a microcontroller or a digital data evaluation means, an analog/digital converter advantageously being arranged upstream of the microcontroller and/or the digital data evaluation means. In this context, a "display unit" should be understood as meaning a unit for optically outputting information and/or for optically transmitting information to an operator of the position-finding device, for example a display unit formed by a display and/or a screen. Furthermore, a "display point" should be understood as meaning, in particular, a point and/or a region, in particular a display region, of the display unit which is formed by a pixel and/or a segment of the display unit and/or by interconnection of a plurality of pixels and/or segments. The sensor unit preferably has a plurality of sensor elements which are each intended to separately measure and/or detect measurement signals. The sensor elements may be formed by all sensors which appear to be useful to a person skilled in the art. However, the individual sensor elements are particularly advantageously in the form of capacitive sensors for detecting a dielectric constant. An arrangement of the sensor elements and/or display points with respect to one another may also be both symmetrical and asymmetrical. In principle, the individual sensor elements may be assigned to the individual display regions as desired. However, a fixed assignment of the sensor elements to the display regions is particularly advantageously provided. As a result of this refinement according to the disclosure, items can be displayed for an operator of the position-finding apparatus in a particularly advantageous manner and an advantageous image of the examination object in at least one dimension can be displayed. In addition, a high degree of ease of use, in particular ease of reading the measurement results, for an operator can be achieved in this case.

The disclosure also proposes that a number of sensor elements of the sensor unit is substantially the same as a number of display points of the display unit in at least one dimension. In this case, a measurement result from the sensor unit can be output for the operator with high resolution and a detailed image of the examination object can therefore be advantageously achieved. The different sensor elements of the sensor unit are preferably each formed by a capacitive sensor, the individual sensor elements being able to be used both as a measuring sensor and as a signal-generating sensor, a method of operation of the individual sensor elements depending on the manner in which the sensor unit is controlled and/or connected. In a particularly advantageous manner, the sensor array has at least 3×3 sensor elements, a spatial resolution of the position-finding unit increasing with a number of sensor elements.

The disclosure also proposes that the display unit is formed by a two-dimensional display unit which is intended to output an image of the examination object in two dimensions. In this context, an "image" should be understood as meaning, in particular, a picture of the examination object, in particular of a wall to be examined, which picture is preferably formed by a projection of a three-dimensional structure and/or a three-dimensional profile of the examination object onto a two-dimensional surface. However, in principle, a projection of the three-dimensional structure and/or the three-dimensional profile of the examination object to form a one-dimensional image is conceivable, in particular with a depth display which can be enabled by means of a varying distance between individual sensor elements, in particular, and/or an electrode spacing between sensor elements which are in the form of capacitive electrodes. The two dimensions preferably extend along two directions which are oriented, in particular, substantially perpendicular to one another. The image, in particular the two-dimensional image, is preferably oriented parallel to a surface of the examination object, in particular a wall surface. This refinement of the disclosure advantageously makes it possible to graphically represent the examination object for an operator and, in association therewith, to easily recognize items detected within the examination object.

The disclosure also proposes that the computation unit is intended to combine at least two measured values during two-dimensional detection using the sensor unit to form one value along one dimension. The at least two measured values from different sensor elements are preferably detected along the one dimension. The computation unit advantageously determines the value from the at least two measured values by calculating an average value. A particularly cost-effective display unit for advantageously displaying or outputting measurement results for the operator can be provided in this case. Furthermore, a one-dimensional representation and/or a one-dimensional image of the examination object can be at least partially output with two-dimensional information content for the operator of the position-finding apparatus.

One advantageous development of the disclosure proposes that the sensor unit has a multiplicity of sensor elements which are arranged in a sensor array. In this context, a "sensor array" should be understood as meaning, in particular, an arrangement of the individual sensor elements with respect to one another, the sensor elements being arranged in rows and columns and/or in a matrix structure and/or in a lattice structure and/or in a grid structure and/or in further arrangements which appear to be useful to a person skilled in the art. A display array of the display unit is advantageously assigned to the sensor array. The different sensor elements of the sensor unit may preferably be used both as a measuring sensor and as a signal-generating sensor, a method of operation of the individual sensor elements depending on the manner in which the individual sensor elements are controlled and/or connected. The sensor array particularly advantageously has at least 3×3 sensor elements, a spatial resolution of the position-finding unit increasing with a number of sensor elements. This arrangement of the individual sensor elements of the sensor unit makes it possible to advantageously scan, or acquire information relating to, an internal structure of the examination object. Furthermore, an arrangement and/or a profile and/or an orientation and/or a shape of an item in the examination object can be detected in detail in this case and this information can be output to the operator in detailed form using the display unit. Furthermore, an item which is smaller than the position-finding apparatus or the sensor unit, in particular along at least one dimension, can be detected in the examination object using static and/or stationary positioning of the position-finding apparatus on the examination object and it is possible to at least partially dispense with movement of the position-finding apparatus for detection. A representation and/or a display of the display unit is preferably updated on the basis of a measuring cycle of the sensor unit. In this case, the representation and/or the display of the display unit can be updated after one measuring cycle or after a plurality of measuring cycles, in which case it may be necessary to average measured values over the plurality of measuring cycles. The display is advantageously updated in a region of approximately 10 Hz.

One advantageous development of the disclosure proposes that the computation unit is intended to activate the sensor elements in succession along at least one dimension for a measurement, thus making it possible to advantageously achieve a high spatial resolution during measuring operation of the position-finding apparatus. In this case, "activated" should be understood as meaning, in particular, that the sensor elements can be individually selected and/or controlled for a measurement and/or measuring operation and can be deactivated by the computation unit during measurement by a further sensor element. In this case, the sensor elements can be activated along a row and/or a column of the sensor array.

The disclosure also proposes that the computation unit is intended to set a constant distance between two varying activated sensor elements, thus enabling high-resolution scanning of the examination object with a substantially constant penetration depth of the measurement signal into the examination object. In addition, an advantageous signal-to-noise ratio can be achieved in this case and/or an advantageous threshold value for a display of the display unit can be set, in particular automatically.

It is also proposed that the computation unit is intended to set a varying distance between two at least partially varying activated sensor elements. In this case, an advantageous item of depth information relating to the examination object can be achieved and, in particular, an item arranged in the examination object can be positioned at a distance from a surface of the examination object for an operator. This information can preferably be retrieved by the operator via the display unit, for example by virtue of the position-finding unit having an operating element which can be used to change over the display unit to a display mode with an item of depth information.

The disclosure also proposes that the computation unit is intended to activate at least one of the sensor elements as a measuring electrode or as a signal-generating electrode, thus advantageously achieving flexible measurement and, in particular, a high resolution of the sensor unit. The measuring electrode is preferably intended to measure or detect the measurement signal and the signal-generating electrode is intended to generate or apply a signal, in particular a signal formed from an electric field, for example a static field or particularly advantageously an alternating field.

Another refinement of the disclosure proposes a method, in particular using a position-finding apparatus, differing sensor elements of a sensor unit being assigned to differing display points of a display unit along at least one dimension. In a particularly advantageous manner, it is possible to display items, in particular, for an operator of the position-finding apparatus and/or to display an advantageous image of the examination object in at least one dimension. In addition, a high degree of ease of use, in particular ease of reading the measurement results, for an operator can be achieved in this case.

It is also proposed that an image of an examination object is displayed along at least one dimension using the display unit. However, a two-dimensional image of the examination object is particularly advantageously displayed using the display unit. It is advantageously possible to graphically represent the examination object for an operator and, in association therewith, to easily recognize items detected within the examination object.

The disclosure also proposes that an orientation of an item is displayed using the display unit, thus advantageously making it possible for an operator to recognize an item. In this case, an "orientation of an item" should be understood as meaning a spatial orientation of an axis, in particular a longitudinal axis, of the item with respect to the examination object and/or gravity acting on the item. In this case, the position of items can be advantageously found on the basis of shape by being able to deliberately aim the selection of items at screws, lines etc., for example, in which case the process of finding the position on the basis of shape can preferably be carried out automatically using a computation unit.

The disclosure also proposes that a constant distance is set between two varying activated sensor elements of a sensor unit, thus enabling high-resolution scanning of the examination object with a substantially constant penetration depth of the measurement signal into the examination object. In addition, an advantageous signal-to-noise ratio can be achieved in this case and/or an advantageous threshold value for a display of the display unit can be set, in particular automatically.

The disclosure also proposes that a varying distance is set between two at least partially varying activated sensor elements, as a result of which an advantageous item of depth information relating to the examination object, in particular an object depth, can be achieved and, in particular, an item arranged in the examination object can be positioned at a distance from a surface of the examination object for an operator. The depth information relating to the examination object, which is determined in this manner, in particular the object depth, is advantageously displayed for an operator of the position-finding device using the display unit.

BRIEF DESCRIPTION OF THE DRAWINGS

Further advantages emerge from the following description of the drawings. The drawings illustrate exemplary embodiments of the disclosure. The drawings, the description and the claims contain numerous features in combination. A person skilled in the art will expediently also consider the features individually and will combine them to form useful further combinations.

In the drawings:

FIG. 3 shows a schematic view of a sensor unit and a display unit of the position-finding device, FIGS. 4a-4i show a schematic view of the sensor unit with a constant distance between two varying sensor elements with different activated sensor elements, FIGS. 5a, 5b show a schematic view of the sensor unit with interconnection of a plurality of sensor elements, FIG. 6 shows a schematic view of the sensor unit with sensor elements which are not connected, FIGS. 7a-7d show a schematic view of the display unit with different representation variants of items, FIGS. 8a-8c show a schematic view of the sensor unit with a varying distance between two sensor elements, FIG. 9 shows a schematic view of an arrangement of the sensor unit with a varying detection radius, FIGS. 10a-10c show a schematic view of the sensor unit with a constant distance between two varying sensor elements, which distance is enlarged in comparison with FIGS. 4a-4i, with different measuring points, and FIG. 11 shows a schematic view of the sensor unit and a display unit with a one-dimensional display.

DETAILED DESCRIPTION

Figure 1:
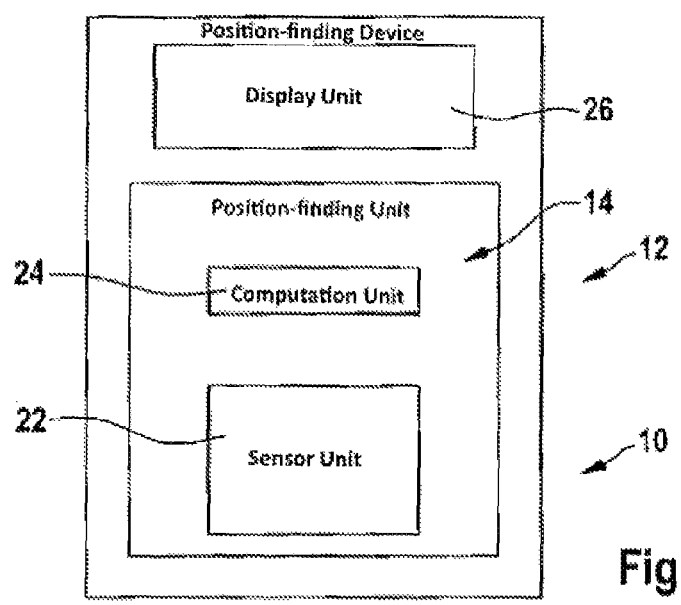
FIG. 1 shows a schematic view of a position-finding device having a position-finding unit.
Figure 2:
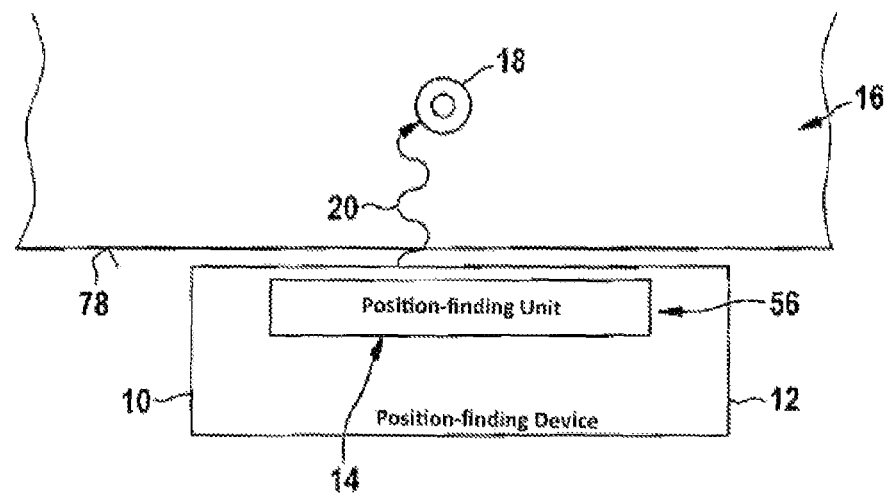
FIG. 2 shows a schematic view of the position-finding device together with an examination object.

FIGS. 1 and 2 schematically illustrate a position-finding apparatus 10 formed by a handheld position-finding device 12. The position-finding device 12 has a position-finding unit 14 which is intended to detect the presence of an item 18 arranged in an examination object 16, for example a wall, using a measurement signal 20. For this purpose, the position-finding unit 14 has a sensor unit 22 and a computation unit 24 which are intended to measure and/or generate the measurement signal 20 and evaluate a measured signal. The position-finding device 12 also has a display unit 26 which is intended to display measured signals and/or measurement results and, in particular, detected items 18, for example a power line and/or water pipe etc. arranged in the wall. During operation of the position-finding device 12, the computation unit 24 is intended to assign differing sensor elements 36, 38, 40 of the sensor unit 22 to differing display points 28, 30, 32, 34 of the display unit 26 along at least one dimension 42, 44 (FIG. 3).

The sensor unit 22 is arranged in a region 56 of the position-finding device 12 facing the examination object 16 and has a multiplicity of sensor elements 36, 38, 40 each formed by a capacitive sensor. The sensor unit 22 also has a sensor array 48, the sensor elements 36, 38, 40 being arranged in rows 58 and columns 60 within the sensor array 48 (FIG. 3). The sensor elements 36, 38, 40 may have a method of operation of a measuring electrode 62 and of a signal-generating electrode 64, this depending on the manner in which the sensor elements 36, 38, 40 are controlled and/or connected. The signal-generating electrode 64 is intended to generate a measurement signal 20, in particular an alternating signal, and the measuring electrode 62 is intended to measure the measurement signal 20. In a normal operating mode of the position-finding unit 14, all sensor elements 36, 38, 40 of the sensor unit 22, with the exception of two sensor elements 36, 38, may be connected to a ground potential, with the result that only the two sensor elements 36, 38 are available for a measurement. An AC voltage is then applied to the sensor element 36 in the form of a signal-generating electrode 64 and the sensor element 38 in the form of a measuring electrode 62 is connected to an input of a high-impedance measuring amplifier (not illustrated in any more detail) of the computation unit 24 by means of a switching means (not illustrated).

During operation of the position-finding unit 14, a voltage parameter is determined at the input of the measuring amplifier, which parameter is a measure of capacitive coupling between the sensor element 36 in the form of a signal-generating electrode 64 and the sensor element 38 in the form of a measuring electrode 62. The voltage parameter can be used to detect a change in a dielectric parameter in the examination object 16 and conclusions with respect to items 18 arranged in the examination object 16 can be made in the computation unit 24 in this case. The computation unit 24 is intended to vary the two selected sensor elements 36, 38, 40 which are controlled and activated for a measurement. On account of the arrangement of the individual sensor elements 36, 38, 40 in the form of an array, a region of the examination object 16, which is covered by the position-finding device 12, is scanned with a high spatial resolution which corresponds substantially to a distance between the individual directly adjacent sensor elements 36, 38, 40, field lines of an applied voltage extending into the examination object 16. Depending on the size of the item 18, movement of the position-finding device 12 by the operator can be dispensed with in order to detect said item if the position-finding device 12, in particular the sensor unit 22, has a greater extent than the item 18 in at least one dimension 42, 44.

The display unit 26 illustrated in FIG. 3 has a number of display points 28, 30, 32, 34 which corresponds substantially to a number of sensor elements 36, 38, 40 of the sensor unit 22, thus enabling high-resolution, detailed display and output for an operator during operation of the position-finding device 12. The display points 28, 30, 32, 34 are each assigned to a sensor element 36, 38, 40 of the sensor unit 22. In this case, the display unit 26 is formed by a display 66, the individual display points 28, 30, 32, 34 being formed by pixels 68 of the display 66. In principle, the display points 28, 30, 32, 34 could be formed by display segments and/or by interconnection of pixels and/or display segments. An arrangement of the individual display points 28, 30, 32, 34 relative to one another corresponds to an arrangement of the individual sensor elements 36, 38, 40 relative to one another, the display points 28, 30, 32, 34 likewise being arranged in rows 70 and columns 72 of a display array 84. However, in principle, two or more sensor elements 36, 38, 40 along a column 60 and/or row 58 of the sensor array 48 could be combined and displayed in one display point 28, 30, 32, 34 of the display unit 26. Furthermore, all sensor elements 36, 38, 40 along one dimension 44, in particular a column 60, may also be combined and displayed in one display point 28, 30, 32, 34, as illustrated in FIG. 11 showing a sensor unit 22 and an alternative display unit 26 with a one-dimensional display 66. In this case, individual measured values from the sensor elements 36, 38, 40 in a column 60 are averaged to form a value using the computation unit 24 and are output at a display point 28, 30, 32, 34.

During operation of the position-finding unit 14, the two-dimensional display unit 26 (FIGS. 3 and 7a to 7d) is used to output an image 46 of the examination object 16 along two dimensions 42, 44. The two dimensions 42, 44 are oriented along two directions 74, 76 which span a surface, in particular parallel to a wall surface 78 of the examination object 16. This image 46 displayed by the display unit 26 contains an item of three-dimensional information relating to the examination object 16 by virtue of an internal structure, in particular the profile of the examination object 16 extending into the examination object 16 in a manner perpendicular to the examination object surface, with items 18 contained therein, being projected onto the two-dimensional image 46. In this case, during operation of the position-finding device 12, an item 18 arranged in the examination object 16 can be displayed in the exact position for an operator and an alignment and/or orientation 54 of the item 18 can also be displayed (FIGS. 8a and 8b). Furthermore, during operation of the position-finding device 12, a width of the item 18 and/or a shape is/are also displayed on the display 66 in order to distinguish different items 18.

The position-finding unit 14 has two different measurement modes which can be selected for a measurement by an operator, for example using a keypad (not illustrated). In a first measurement mode, the computation unit 24 sets a constant distance 50 between two varying sensor elements 36, 38, 40 which are controlled and activated for a measurement by the computation unit 24. In this case, the individual pairs of sensor elements 36, 38, 40 which are controlled and activated for a measurement are activated in succession by the computation unit 24 (FIGS. 4a to 4i). During the measurement, the capacitive coupling and/or the measurement signals 20 is/are dominantly influenced by surface effects of the wall, this influence being substantially the same for all pairs of sensor elements 36, 38, 40. In contrast, if a pair of sensor elements 36, 38, 40 covers an item 18 in the examination object 16, the measurement signal 20, in particular the capacitive coupling, of the two sensor elements 36, 38, 40 differs from measurement signals from further sensor elements 36, 38, 40. In order to separate an item signal from background signals, the computation unit 24 forms an average value of the measured measurement signals 20 from all sensor elements 36, 38, 40 and subtracts this average value from the individual measurement signals. In principle, it is also conceivable for the background signal to be effected by means of an explicit background measurement, for example on a homogeneous examination object, and/or on the basis of values in the form of a correction factor from a table which is determined during factory calibration for each sensor element 36, 38, 40 and is stored in the computation unit 24. If undesirable decalibration of the position-finding device 12 has taken place, it is sufficient for the position-finding device 12 to be held in the air before a position-finding operation, the sensor unit 22 being automatically calibrated by the computation unit 24.

If the computation unit 24 subtracts the background signal from the respective measurement signal 20 from the sensor elements 36, 38, 40, an item signal matrix results and is displayed for the operator using the display unit 26, in particular the display 66. In this case, the individual display points 28, 30, 32, 34 can be displayed with different gray tones and/or in color in order to display a spatial profile and/or a shape of the items 18. In this case, items in the examination object 16 can be located and displayed even in a static measurement in which movement of the position-finding device 12 can cease if the item 18 is smaller than the sensor unit 22 in at least one dimension 42, 44. In the case of an item 18 having a large area, it is necessary to move the position-finding device 12 back and forth over the surface of the examination object 16 in order to determine the background.

The display unit 26 is regularly updated by the computation unit 24 during operation of the position-finding unit 14. In this case, an updating period advantageously corresponds to one measuring cycle of the sensor array 48 of the sensor unit 22. Within a measuring cycle, all sensor elements 36, 38, 40 are activated and/or controlled for a measurement in succession, with the result that a complete image 46 of the examination object 16 can be displayed on the display 66. The updating can also be preferably adapted to movement of the position-finding unit 14 over the examination object 16, with the result that a current image 46 of the examination object 16 is continuously transmitted to the operator using the display unit 26. In this case, an activation frequency is advantageously approximately 10 Hz.

In order to make a display of the display unit 26 quiet for the operator and/or in order to reduce interference during a display and/or a representation by the display unit 26, an inhomogeneity parameter in the detected signals is also automatically determined, if appropriate, in the computation unit 24 in addition to an average value subtraction, which parameter influences a display threshold of the display unit 26. In this case, a difference between a lowest measurement signal 20 and a highest measurement signal 20 is continuously determined by the computation unit 24 and only item signals above this threshold are recognized as such by the computation unit 24 and are output by the display unit 26. In this case, sensitivity of the sensor unit 22 is reduced but irreproducible signals and/or displays are advantageously suppressed by the computation unit 24. In this case, this dynamic threshold adaptation can be carried out after a respective measuring cycle and/or over all measuring cycles within a particular interval of time.

The sensor elements 36, 38, 40 which have been controlled and activated can be varied along the first dimension 42, in particular along a row 58 of the sensor array 48, or along the second dimension 44, in particular along a column 60 of the sensor array 48 (FIGS. 4a to 4i). The computation unit 24 is also intended to connect the pairs of sensor elements 36, 38, 40 along the first dimension 42 or the second dimension 44 to one another during operation of the position-finding device 12. Furthermore, an orientation of a pair of sensor elements 36, 38, 40 can be changed in order to detect items 18, with the result that an item of information relating to a type and/or a position of the item 18 can be effectively acquired. Pairs of sensor elements 36, 38, 40, for example, are thus influenced to a much greater extent by lines having an orientation substantially parallel to the pairs of sensor elements 36, 38, 40 than by lines having an orientation substantially transverse to the orientation of the pair of sensor elements 36, 38, 40.

An arrangement of the sensor elements 36, 38, 40 in the sensor array 48 may be both symmetrical and asymmetrical. Furthermore, it is conceivable for a plurality of sensor elements 36, 38, 40, in particular a row 58 or a column 60 of sensor elements 36, 38, 40, to be interconnected by the computation unit 24 and to be in the form of a measuring electrode 62 or a signal-generating electrode 64 (FIGS. 5a and 5b). A large electrode area for generating a larger measurement signal 20 can be achieved in this case. Furthermore, the computation unit 24 is intended to form the sensor elements 36, 38 of the sensor array 48, which are arranged in an outer edge region 80 of the sensor array 48, as dummy electrodes 82, with the result that a uniform coupling characteristic of the remaining sensor elements 40 is achieved (FIG. 6). The dummy electrodes 82 are arranged without a connection, in particular in an electrically non-conductive manner, with respect to the remaining sensor elements 40.

In addition, the operator can change over to a further measurement mode during operation of the position-finding device 12. The further measurement mode allows a position-finding measurement with different penetration depths of the measurement signal 20, with the result that a depth of the item 18 and/or a depth position of the item 18 can be determined. In this case, the computation unit 24 varies a distance 52 between two activated and controlled sensor elements 36, 38, 40 of a pair of sensor elements 36, 38, 40 with respect to a second pair of activated and controlled sensor elements 36, 38, 40 (FIGS. 8a to 9). The greater the distance 52 between the two activated and controlled sensor elements 36, 40, the greater a penetration depth of the measurement signal 20 and thus a range of a field generated by the signal-generating electrode 64. In principle, automatic scanning of the depth of the examination object 16 is possible at any time using the computation unit 24. In order to display a position depth of the item 18, an operator can change over a display mode using the keypad. In addition, scanning of the examination object 16 with a great distance 50 between the individual activated and controlled sensor elements 36, 38, 40 can also be set by the computation unit 24, thus making it possible to acquire an item of information relating to the depth of the examination object 16 over a large area (FIGS. 10a to 10c).

During operation of the position-finding device 12, an operator can activate a further mode by virtue of the computation unit 24 automatically deliberately looking for predefined signal patterns when evaluating the measuring cycles and by virtue of these patterns then being displayed in the display unit 26 for the operator. For example, an item pattern can be selected in this case, such as, in particular, pipes and/or lines and/or screws etc., the computation unit 24 generating a complete image of the examination object and looking through the complete image for the predefined item pattern and displaying only the corresponding items 18 for the operator, with the result that the corresponding items 18 can be easily discerned in the display unit 26 by an operator, for example signals from items 18 in the case of an irregular background signal, as may be advantageous, in particular, in hollow cavity building materials which are at least partially dielectrically inhomogeneous.

The invention claimed is:

1. A handheld position-finding device, comprising:
  a position-finding unit, which is configured to detect the presence of an item arranged in an examination object using a measurement signal, the position-finding unit including
    a sensor unit including a plurality of sensor elements,
    a computation unit, and
    a display unit including a plurality of display points,
  wherein the computation unit is configured to activate at least two sensor elements of the plurality of sensor elements to generate a measured value for each display point in the plurality of display points, the at least two sensor elements activated to generate the measured value being different for each of the display points,
  wherein the computation is configured to activate a first one of the at least two sensor elements as a signal-generating electrode to generate a measurement signal and to activate a second one of the at least two sensor elements as a measuring electrode to output the measured value as a measurement of the measurement signal,
  wherein the computation unit is configured to connect the sensor elements not being activated to generate a measured value to ground potential, and
  wherein the computation unit is configured to control each of the display points based in part on the measured value generated by the at least two sensor elements activated for each respective to the display point.

2. The position-finding apparatus as claimed in claim 1, wherein a number of sensor elements of the sensor unit is substantially the same as a number of display points of the display unit in at least one dimension.

3. The position-finding apparatus as claimed in claim 1, wherein the display unit is formed by a two-dimensional array of display points which is configured to output an image of the examination object in two dimensions.

4. The position-finding apparatus as claimed in claim 1, wherein the computation unit is configured to combine at least two measured values during two-dimensional detection using the sensor unit to form one value along one dimension.

5. The position-finding apparatus as claimed in claim 1, wherein the sensor unit has a multiplicity of sensor elements which are arranged in a sensor array.

6. The position-finding apparatus as claimed in claim 5, wherein the computation unit is configured to activate the sensor elements in succession along at least one dimension for a measurement.

7. The position-finding apparatus as claimed in claim 5, wherein the computation unit is configured to set a constant distance between two activated sensor elements.

8. The position-finding apparatus as claimed in claim 5, wherein the computation unit is configured to set a varying distance between two activated sensor elements.

9. A method of using a position-finding apparatus, comprising:
  activating at least two sensor elements of a plurality of sensor elements of a sensor unit of the position-finding apparatus to generate a measured value for to each display point of a plurality of display points of a display unit along at least one dimension, the at least two sensor elements activated to generate a measured value being different for each of the display points;
  activating each of the display points based in part on the measured signal generated by the at least two sensor elements activated for each respective the display point,
  wherein a first one of the at least two sensor elements is activated as a signal-generating electrode to generate a measurement signal and a second one of the at least two sensor elements is activated as a measuring electrode to output the measured value as a measurement of the measurement signal,
  wherein the sensor elements not being activated to generate a measured value are connected to ground potential.

10. The method as claimed in claim 9, wherein an image of an examination object is displayed along at least one dimension using the display unit.

11. The method as claimed in claim 9, wherein a two-dimensional image of an examination object is displayed using the display unit.

12. The method as claimed in claim 9, wherein an orientation of an examination object is displayed using the display unit.

13. The method as claimed in claim 9, wherein a constant distance is set between two activated sensor elements of a sensor unit.

14. The method as claimed in claim 9, wherein a varying distance is set between two activated sensor elements.

15. The method as claimed in claim 14, wherein an object depth is determined using the varying distance between two at least partially varying activated sensor elements.

* * * * *